(12) United States Patent
Ma et al.

(10) Patent No.: US 8,450,180 B2
(45) Date of Patent: May 28, 2013

(54) METHODS OF FORMING SEMICONDUCTOR TRENCH AND FORMING DUAL TRENCHES, AND STRUCTURE FOR ISOLATING DEVICES

(75) Inventors: Chu-Ming Ma, Hsinchu (TW); Tin-Wei Wu, Hsinchu (TW); Chih-Hsiang Yang, Hsinchu (TW)

(73) Assignee: MACRONIX International Co. Ltd., Hsinchu (TW)

( * ) Notice: Subject to any disclaimer, the term of this patent is extended or adjusted under 35 U.S.C. 154(b) by 58 days.

(21) Appl. No.: 12/981,905

(22) Filed: Dec. 30, 2010

(65) Prior Publication Data

US 2012/0168897 A1 Jul. 5, 2012

(51) Int. Cl.
*H01L 21/331* (2006.01)

(52) U.S. Cl.
USPC .... 438/359; 438/221; 438/296; 257/E21.546; 257/E21.548; 257/E21.549

(58) Field of Classification Search
None
See application file for complete search history.

(56) References Cited

U.S. PATENT DOCUMENTS

| | | | |
|---|---|---|---|
| 6,274,457 B1* | 8/2001 | Sakai et al. | 438/424 |
| 2008/0102579 A1* | 5/2008 | Dong et al. | 438/243 |
| 2008/0146000 A1* | 6/2008 | Lee | 438/424 |
| 2008/0248627 A1* | 10/2008 | Haussmann et al. | 438/427 |

* cited by examiner

*Primary Examiner* — Benjamin Sandvik
*Assistant Examiner* — Leslie Pilar Cruz
(74) *Attorney, Agent, or Firm* — J.C. Patents

(57) ABSTRACT

Methods of forming a semiconductor trench and forming dual trenches and a structure for isolating devices are provided. The structure for isolating devices is disposed in a substrate having a periphery area and an array area. The structure for isolating devices includes a first isolation structure and a second isolation structure. The first isolation structure has a profile with at least three steps and is disposed in the substrate in the periphery area. The second isolation structure has a profile with at least two steps and is disposed in the substrate in the array area.

13 Claims, 4 Drawing Sheets

METHODS OF FORMING SEMICONDUCTOR TRENCH AND FORMING DUAL TRENCHES, AND STRUCTURE FOR ISOLATING DEVICES

BACKGROUND OF THE INVENTION

1. Field of Invention

The present invention relates to a semiconductor structure and a manufacturing method thereof, and more generally to dual isolation structures or dual trenches having different depths and a manufacturing method thereof.

2. Description of Related Art

Due to the rapid development of integrated circuit technologies, device miniaturization and integration become the major trends in the semiconductor manufacturing industry. As the dimension of a device continues to shrink and the level of integration continues to increase, a structure for isolating devices is required to reduce accordingly. Hence, with device miniaturization, isolation structures are increasingly difficult to fabricate.

Because a shallow trench isolation (STI) structure is scalable without causing any bird's beak encroachment problem as in the conventional local oxidation of silicon (LOCOS) process, it is the preferred isolation technique for a sub-micron (or smaller dimension) metal-oxide-semiconductor fabrication process.

In addition, the required depths of isolation structures are varied according to different applications for a periphery area and an array area in a memory device. Generally speaking, the depth of a STI structure in the periphery area is much greater than that in the array area. Therefore, at least two photolithography processes are required to fabricate such dual isolation structures having different depths, so that the process is complicated and the cost is high.

SUMMARY OF THE INVENTION

Accordingly, the present invention provides a structure for isolating devices and a manufacturing method thereof, in which only one photolithography process is required to fabricate dual isolation structures having different depths. The process is simple and the cost is saved.

The present invention provides a method of forming a semiconductor trench. A substrate having a periphery area and an array area is provided. A mask layer is formed on the substrate, wherein the mask layer has a first opening to expose the substrate in the periphery area and a second opening to expose the substrate in the array area. A first spacer is formed on a sidewall of the first opening. A recess is formed in the substrate in the periphery area by using the mask layer and the first spacer as a mask. A second spacer is formed on a sidewall of the second opening, and a portion of the first spacer is removed to expose top corners of the recess. A portion of the substrate is removed by using the mask layer, the first spacer and the second spacer as a mask, so as to form a first trench in the substrate in the periphery area and a second trench in the substrate in the array area.

According to an embodiment of the present invention, the first opening is greater than the second opening.

According to an embodiment of the present invention, the step of forming the first spacer on the sidewall of the first opening includes the following steps. A dielectric material layer is formed on the substrate, wherein a thickness of the dielectric material layer is greater than a half width of the second opening. A portion of the dielectric material layer is removed until a surface of the mask layer is exposed, wherein the remaining dielectric material layer forms the first spacer on the sidewall of the first opening and fills up the second opening.

According to an embodiment of the present invention, the method further includes filling a first dielectric layer in the first trench and the second trench, wherein a material of the dielectric material layer is the same as a material of the first dielectric layer.

According to an embodiment of the present invention, after the step of forming the first trench and the second trench and before the step of forming the first dielectric layer, the method further includes removing the first spacer and the second spacer, and forming a liner layer on surfaces of the first trench and the second trench.

According to an embodiment of the present invention, a surface of the substrate exposed by the first opening and the second opening is lower than a bottom surface of the mask layer.

According to an embodiment of the present invention, the first trench has a profile with at least three steps, and the second trench has a profile with at least two steps.

According to an embodiment of the present invention, a depth of the first trench is 2-3 times a depth of the second trench.

The present invention further provides a method of forming dual trenches. A substrate having a first area and a second area is provided. A mask layer is formed on the substrate, wherein the mask layer has a first opening to expose the substrate in the first area and a second opening to expose the substrate in the second area. A first spacer is formed on a sidewall of the first opening and a first dielectric layer is formed to fill up the second opening. A recess is formed in the substrate in the first area by using the mask layer and the first spacer as a mask. A portion of the first dielectric layer is removed to form a second spacer on a sidewall of the second opening, and a portion of the first spacer is removed to expose top corners of the recess. A portion of the substrate is removed by using the mask layer, the first spacer and the second spacer as a mask, so as to form a first trench in the substrate in the first area and a second trench in the substrate in the second area.

According to an embodiment of the present invention, the first opening is greater than the second opening.

According to an embodiment of the present invention, the step of forming the first spacer on the sidewall of the first opening and forming the first dielectric layer to fill up the second opening includes the following steps. A dielectric material layer is formed on the substrate, wherein a thickness of the dielectric material layer is greater than a half width of the second opening. A portion of the dielectric material layer is removed until a surface of the mask layer is exposed.

According to an embodiment of the present invention, a depth of the first trench is 2-3 times a depth of the second trench.

According to an embodiment of the present invention, the substrate includes a dielectric material.

The present invention also includes a structure for isolating devices. The structure for isolating devices is disposed in a substrate having a periphery area and an array area. The structure for isolating devices includes a first isolation structure. The first isolation structure has a profile with at least three steps and is disposed in the substrate in the periphery area.

According to an embodiment of the present invention, the structure for isolating devices further includes a second isolation structure disposed in the substrate in the array area, wherein the second isolation structure has a profile with at least two steps.

According to an embodiment of the present invention, the first isolation structure and the second isolation structure each include a liner layer and a dielectric layer.

According to an embodiment of the present invention, a depth of the first isolation structure is 2-3 times a depth of the second isolation structure.

In view of the above, in the method of the present invention, only one photolithography process is required to fabricate dual isolation structures or dual trenches having different depths as compared with the conventional two photolithography processes. Thus, the process is simple, the cost is saved and the competitive advantage is achieved. Further, the dual isolation structures having different depths of the present invention can be respectively applied to a periphery area and an array area in a memory device, so as to meet the design requirements of the memory device.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
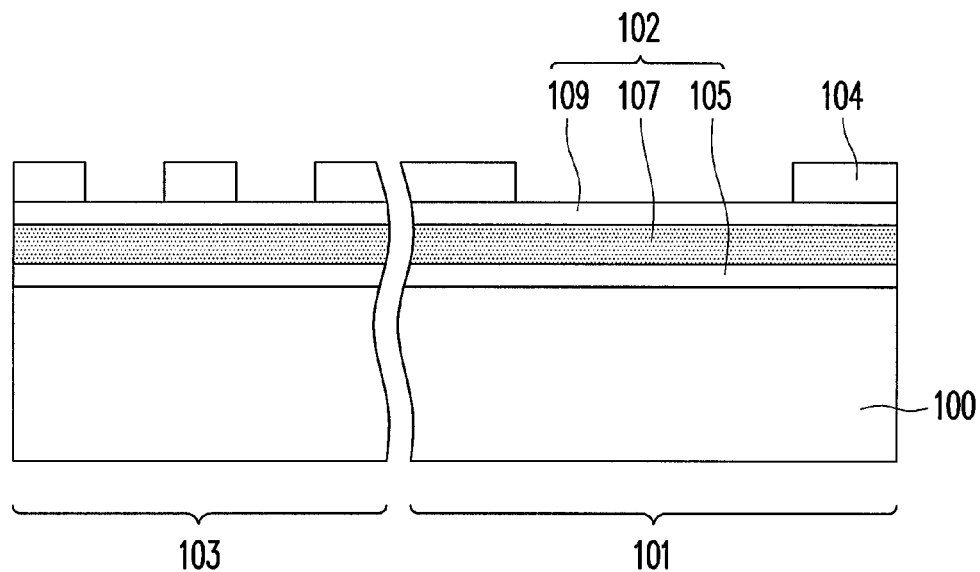
FIGS. 1A to 1H schematically illustrate cross-sectional views of a method of forming a semiconductor trench according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H schematically illustrate cross-sectional views of a method of forming a semiconductor trench according to an embodiment of the present invention.

Referring to FIG. 1A, a substrate 100 is provided. The substrate 100 can be a semiconductor substrate such as a silicon substrate. The substrate 100 has a first area 101 and a second area 103. When the present invention is applied to a memory device, the first area 101 can be a periphery area and the second area 103 can be an array area. The periphery area 101 and the array area 103 are illustrated in the following for the purpose of clarity.

Thereafter, a mask material layer 102 and a patterned photoresist layer 104 are sequentially formed on the substrate 100. The method of forming the mask material layer 102 includes performing a chemical vapour deposition (CVD) process. The mask material layer 102 can be a single layer or a multilayer structure. The material of the mask material layer 102 is selected from silicon oxide, silicon carbide, silicon nitride, silicon oxynitride and a combination thereof. In an embodiment, the mask material layer 102 can be a triple-layer structure including a bottom oxide layer 105, a silicon nitride layer 107 and a top oxide layer 109.

Figure 1B:
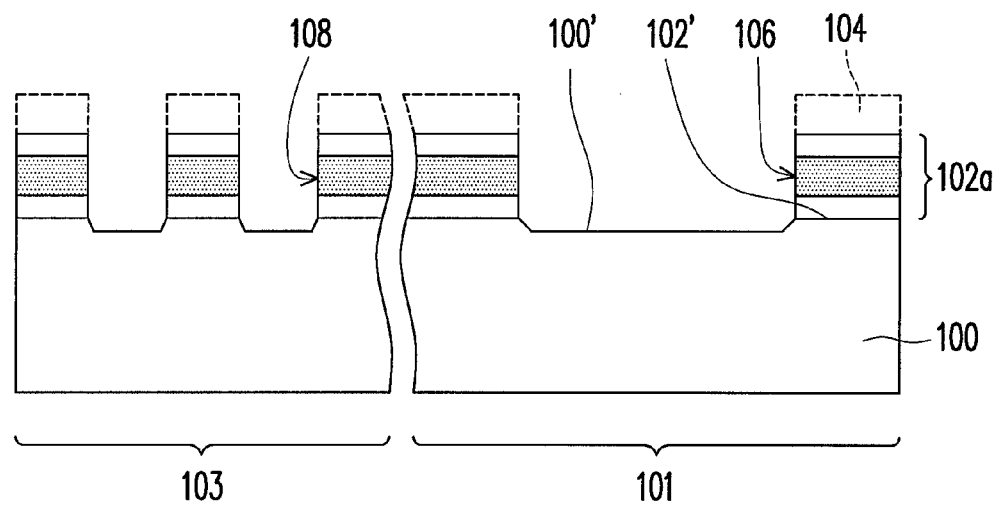

Referring to FIG. 1B, a portion of the mask material layer 102 is removed by using the patterned photoresist layer 104 as a mask, so as to form a mask layer 102a. The mask layer 102a has a first opening 106 to expose the substrate 100 in the periphery area 101 and second openings 108 to expose the substrate 100 in the array area 103. The method of removing the portion of the mask material layer 102 includes performing a dry etching process. The dry etching process includes a breakthrough etching step, a main etching step and an over-etching step. In an embodiment, when the over-etching step is performed, the surface 100' of the substrate 100 exposed by the first opening 106 and the second openings 108 is lower than the bottom surface 102' of the mask layer 102a, as shown in FIG. 1B. In another embodiment (not shown), the surface 100' of the substrate 100 exposed by the first opening 106 and the second openings 108 is substantially equal to the bottom surface 102' of the mask layer 102a. Afterwards, the patterned photoresist layer 104 is removed.

In the above-mentioned embodiment, one first opening 106 and two second openings 108 are provided for illustration purposes, and are not construed as limiting the present invention. In other words, the number of the first opening 106 and the second opening 108 is not limited by the present invention.

Figure 1C:
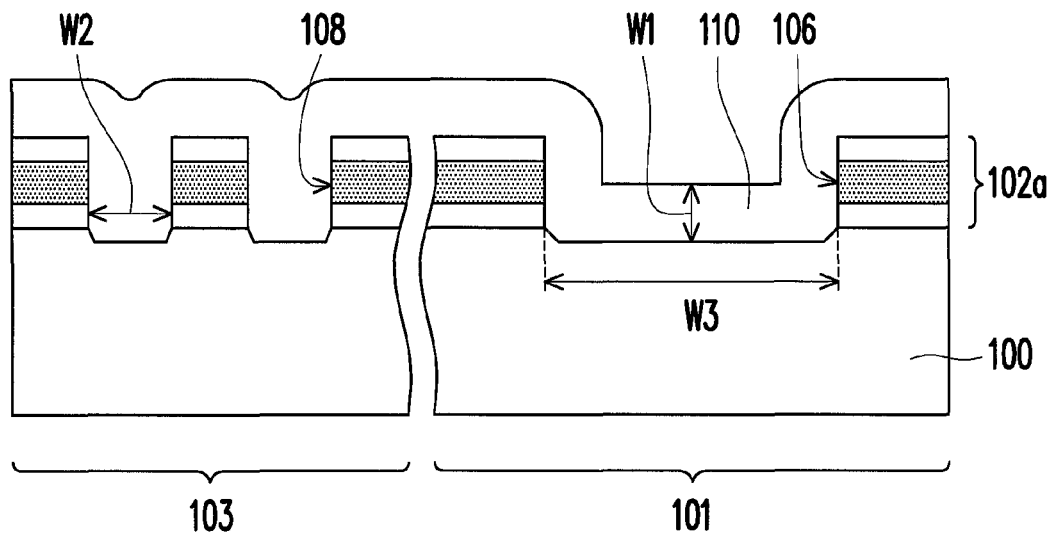

Referring to FIG. 1C, a dielectric material layer 110 is formed on the substrate 100. The method of forming the dielectric material layer 110 includes performing a CVD process. The material of the dielectric material layer 110 is silicon oxide or silicon nitride, for example. It is noted that the thickness W1 of the dielectric material layer 110 is greater than half of the width W2 of each second opening 108, but smaller than half of the width W3 of the first opening 106. That is, the thickness W1 of the dielectric material layer 110 is large enough to fill up the second openings 108 but not enough to fill up the first opening 106.

Figure 1D:
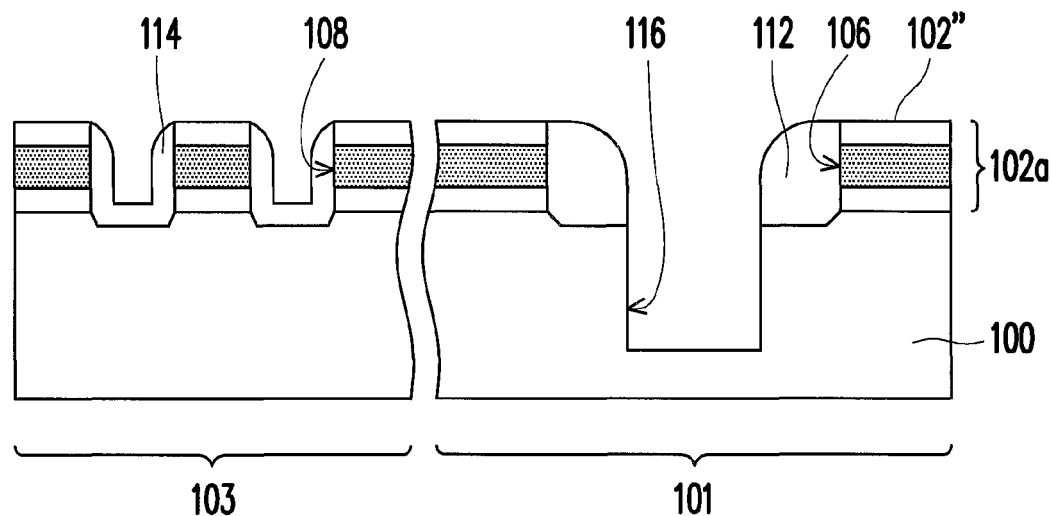

Referring to FIG. 1D, a portion of the dielectric material layer 110 is removed until the surface 102" of the mask layer 102a is exposed, so as to form a first spacer 112 on the sidewall of the first opening 106 and form the first dielectric layer 114 to fill up the second openings 108. Thereafter, a recess 116 is formed in the substrate 100 in the periphery area 101 by using the mask layer 102a and the first spacer 112 as a mask. The method of removing the portion of the dielectric material layer 110 and forming the recess 116 includes performing a two-step dry etching process. That is, the steps in FIG. 1D can be performed in the same chamber.

Figure 1E:
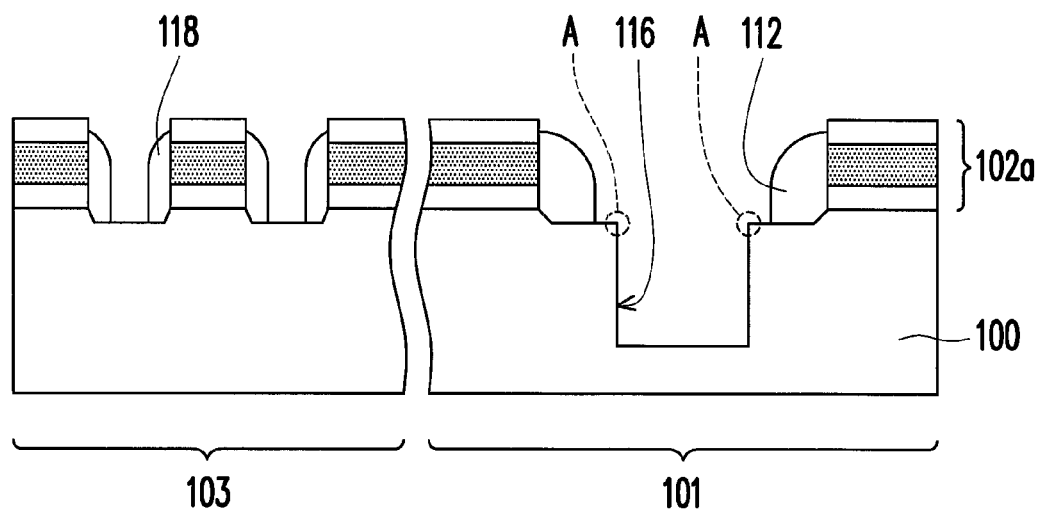

Referring to FIG. 1E, a portion of the first dielectric layer 114 is removed to form a second spacer 118 on the sidewall of each second opening 108, and a portion of the first spacer 112 is removed to expose top corners A of the recess 116. The method of removing the portion of the first dielectric layer 114 and removing the portion of the first spacer 112 includes performing a wet etching process.

Figure 1F:
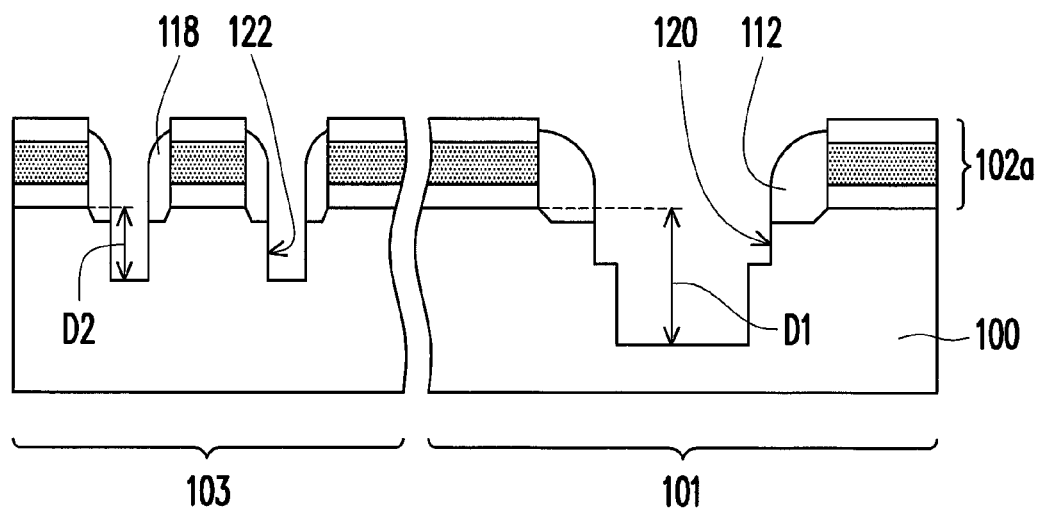

Referring to FIG. 1F, a portion of the substrate 100 is removed by using the mask layer 102a, the first spacer 112 and the second spacer 118 as a mask, so as to form a first trench 120 in the substrate 100 in the periphery area 101 and a second trench 122 in the substrate 100 in the array area 103. The first trench 120 has a profile with at least three steps, and the second trench 122 has a profile with at least two steps. The depth D1 of the first trench 120 is 2-3 times the depth D2 of the second trench 122. In an embodiment, the depth D1 of the first trench 120 is 3,500 angstroms, and the depth D2 of the second trench 122 is 1,400 angstroms. The method of forming the first trench 120 and the second trench 122 includes performing a dry etching process.

Figure 1G:
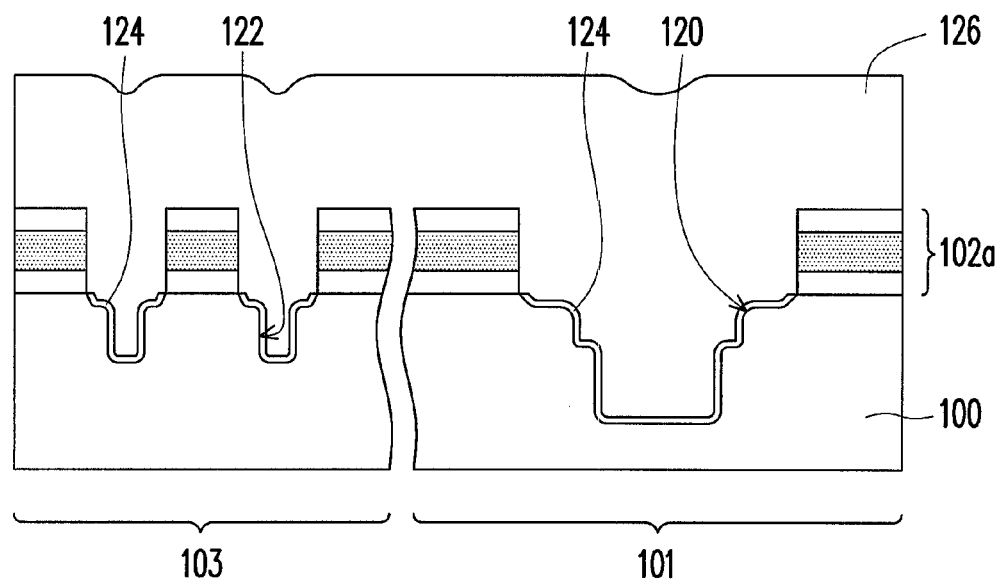

Referring to FIG. 1G, the first spacer 112 and the second spacer 118 are removed. The method of removing the first spacer 112 and the second spacer 118 includes performing a wet etching process. Thereafter, a liner layer 124 is formed on surfaces of the first trench 120 and the second trench 122. The material of the liner layer 124 is silicon oxide, for example. The method of forming the liner layer 124 includes performing a thermal oxidation process. During the step of forming the liner layer 124, sharp corners of the first trench 120 and the second trench 122 are also rounded.

Thereafter, a second dielectric layer 126 is formed to fill in the first trench 120 and the second trench 122. The method of forming the second dielectric layer 126 includes performing a CVD process. The material of the second dielectric layer 126 is silicon oxide or silicon nitride, for example. In an embodiment, the second dielectric layer 126 and the dielectric material layer 110 include the same material, such as silicon oxide. In another embodiment, the second dielectric layer 126 and the dielectric material layer 110 include different materials.

It is noted that the step of removing the first spacer 112 and the second spacer 118 and the step of forming the liner layer 124 can be omitted, so that the second dielectric layer 126 is directly formed on the first spacer 112 and the second spacer 118 to fill in the first trench 120 and the second trench 122.

Figure 1H:
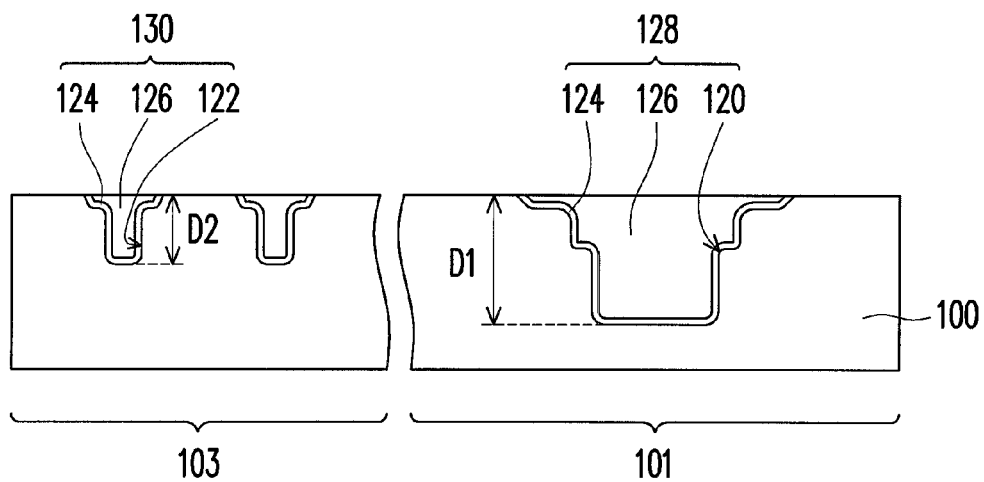

Referring to FIG. 1H, the second dielectric layer 126 outside the first trench 120 and the second trench 122 is removed by a dry etching process. Thereafter, the mask layer 102a is removed by another dry etching process. A first isolation structure 128 and a second isolation structure 130 are thus completed.

In view of the above, the structure for isolating devices of the present invention includes dual isolation structures having different depths (i.e. the first isolation structure 128 and the second isolation structure 130 in FIG. 1H), and only one photolithography process (i.e. the patterned photoresist layer 104 in FIG. 1A) is required in the manufacturing method thereof. The process is simple and the cost is saved.

The structure in FIG. 1H is taken to illustrate the structure for isolating devices of the present invention. The structure for isolating devices of the present invention is disposed in a substrate 100 has a periphery area 101 and an array area 103. The structure for isolating devices includes a first isolation structure 128 and a second isolation structure 130. The first isolation structure 128 has a profile with at least three steps and is disposed in the substrate 100 in the periphery area 101. The second isolation structure 130 has a profile with at least two steps and is disposed in the substrate 100 in the array area 103. The first isolation structure 128 and the second isolation structure 130 each include a liner layer 124 and a second dielectric layer 126. The depth D1 of the first isolation structure 128 is 2-3 times the depth D2 if the second isolation structure 130.

In the above-mentioned embodiment, the manufacturing method of the trenches is applied to form a structure for isolating devices. However, the present invention is not limited thereto. The manufacturing method of the trenches can be applied to form a material layer with dual trenches having different depths therein. For example, the substrate is not limited to be a semiconductor substrate. The substrate can be a dielectric material substrate. Further, the layer filling in the trenches is not limited to be a dielectric layer. In another embodiment, dual trenches are formed in a dielectric layer, and a conductive layer is filled in the trenches. The conductive layer can include metal layers having different thicknesses. The metal layers having different thicknesses serve as conductive wires or metal wires.

In summary, in the method of the present invention, only one photolithography process is required to fabricate dual isolation structures or dual trenches having different depths, and the conventional two photolithography processes are not necessary. Thus, the process is simple, the cost is saved and the competitive advantage is achieved. Further, the dual isolation structures having different depths of the present invention can be respectively applied to a periphery area and an array area in a memory device, so as to meet the design requirements of the memory device.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a semiconductor trench, comprising:
   providing a substrate having a periphery area and an array area;
   forming a mask layer on the substrate, wherein the mask layer has a first opening to expose the substrate in the periphery area and a second opening to expose the substrate in the array area;
   forming a first spacer on all sidewalls of the first opening;
   forming a recess in the substrate in the periphery area by using the mask layer and the first spacer as a mask;
   forming a second spacer on all sidewalls of the second opening, and removing a portion of the first spacer to expose top corners of the recess; and
   removing a portion of the substrate by using the mask layer, the first spacer and the second spacer as a mask, so as to form a first trench in the substrate in the periphery area and a second trench in the substrate in the array area,
   wherein the first spacer and the second spacer are formed from the same dielectric material.

2. The method of claim 1, wherein the first opening is greater than the second opening.

3. The method of claim 1, wherein the step of forming the first spacer on the sidewall of the first opening comprises:
   forming a dielectric material layer on the substrate, wherein a thickness of the dielectric material layer is greater than a half width of the second opening; and
   removing a portion of the dielectric material layer until a surface of the mask layer is exposed, wherein the remaining dielectric material layer forms the first spacer on the sidewall of the first opening and fills up the second opening.

4. The method of claim 3, further comprising forming a first dielectric layer to fill in the first trench and the second trench, wherein a material of the dielectric material layer is the same as a material of the first dielectric layer.

5. The method of claim 4, further comprising, after the step of forming the first trench and the second trench and before the step of forming the first dielectric layer,
   removing the first spacer and the second spacer; and
   forming a liner layer on surfaces of the first trench and the second trench.

6. The method of claim 1, wherein a surface of the substrate exposed by the first opening and the second opening is lower than a bottom surface of the mask layer.

7. The method of claim 6, wherein the first trench has a profile with at least three steps, and the second trench has a profile with at least two steps.

8. The method of claim 1, wherein a depth of the first trench is 2-3 times a depth of the second trench.

9. A method of forming dual trenches, comprising:
   providing a substrate having a first area and a second area;
   forming a mask layer on the substrate, wherein the mask layer has a first opening to expose the substrate in the first area and a second opening to expose the substrate in the second area;

forming a first spacer on all sidewalls of the first opening and simultaneously forming a first dielectric layer to fill up the second opening;

forming a recess in the substrate in the first area by using the mask layer and the first spacer as a mask;

removing a portion of the first dielectric layer to form a second spacer on all sidewalls of the second opening, and simultaneously removing a portion of the first spacer to expose top corners of the recess; and removing a portion of the substrate by using the mask layer, the first spacer and the second spacer as a mask, so as to form a first trench in the substrate in the first area and a second trench in the substrate in the second area, wherein the first spacer and the second spacer are formed from the same dielectric material.

10. The method of claim 9, wherein the first opening is greater than the second opening.

11. The method of claim 9, wherein the step of forming the first spacer on the sidewall of the first opening and forming the first dielectric layer to fill up the second opening comprises:

forming a dielectric material layer on the substrate, wherein a thickness of the dielectric material layer is greater than a half width of the second opening; and removing a portion of the dielectric material layer until a surface of the mask layer is exposed.

12. The method of claim 9, wherein a depth of the first trench is 2-3 times a depth of the second trench.

13. The method of claim 9, wherein the substrate comprises a dielectric material.

* * * * *